United States Patent [19]

Trelewicz et al.

[11] Patent Number: 5,218,325
[45] Date of Patent: Jun. 8, 1993

[54] LOW NOISE OSCILLATOR

[75] Inventors: Eric Trelewicz, Mesa; Michael N. Pickett, Phoenix; Robert H. Bickley, Scottsdale, all of Ariz.

[73] Assignee: Motorola, Inc., Schaumburg, Ill.

[21] Appl. No.: 860,855

[22] Filed: Mar. 31, 1992

[51] Int. Cl.$^5$ .............................................. H03B 5/12
[52] U.S. Cl. ..................... 331/117 FE; 331/36 C; 331/44; 331/74; 331/177 V; 455/260; 455/264
[58] Field of Search ............ 331/8, 36 R, 36 C, 36 L, 331/74, 117 R, 117 FE, 117 D, 116 R, 116 FE, 177 R, 177 V, 44; 455/260, 264

[56] References Cited

U.S. PATENT DOCUMENTS

| | | | |
|---|---|---|---|
| 3,375,467 | 3/1968 | Weinrich | 331/117 |
| 4,158,182 | 6/1979 | Washburn | 331/117 R |
| 4,590,443 | 5/1986 | Ishigaki et al. | 331/117 R |
| 4,626,802 | 12/1986 | Gailus | 331/117 FE |
| 5,063,358 | 11/1991 | Vale et al. | 331/60 |
| 5,107,228 | 4/1992 | Pham et al. | 331/117 R X |

Primary Examiner—David Mis
Attorney, Agent, or Firm—Frank J. Bogacz

[57] ABSTRACT

A low noise oscillator for use in a radio which provides an output signal with high signal-to-noise ratio. The low noise oscillator includes a voltage controlled oscillator which produces an intermediate sinusoidal voltage signal in response to a DC tuning voltage. The voltage controlled oscillator includes a varactor and junction field effect transistor. The low noise oscillator also includes a buffer amplifier which receives the intermediate sinusoidal voltage signal from a tapped microstrip of the voltage controlled oscillator and produces a highly stable output signal proportional to the DC tuning voltage applied to the input of the low noise oscillator. The buffer amplifier employs a dual gate Gallium Arsenide field effect transistor.

20 Claims, 1 Drawing Sheet

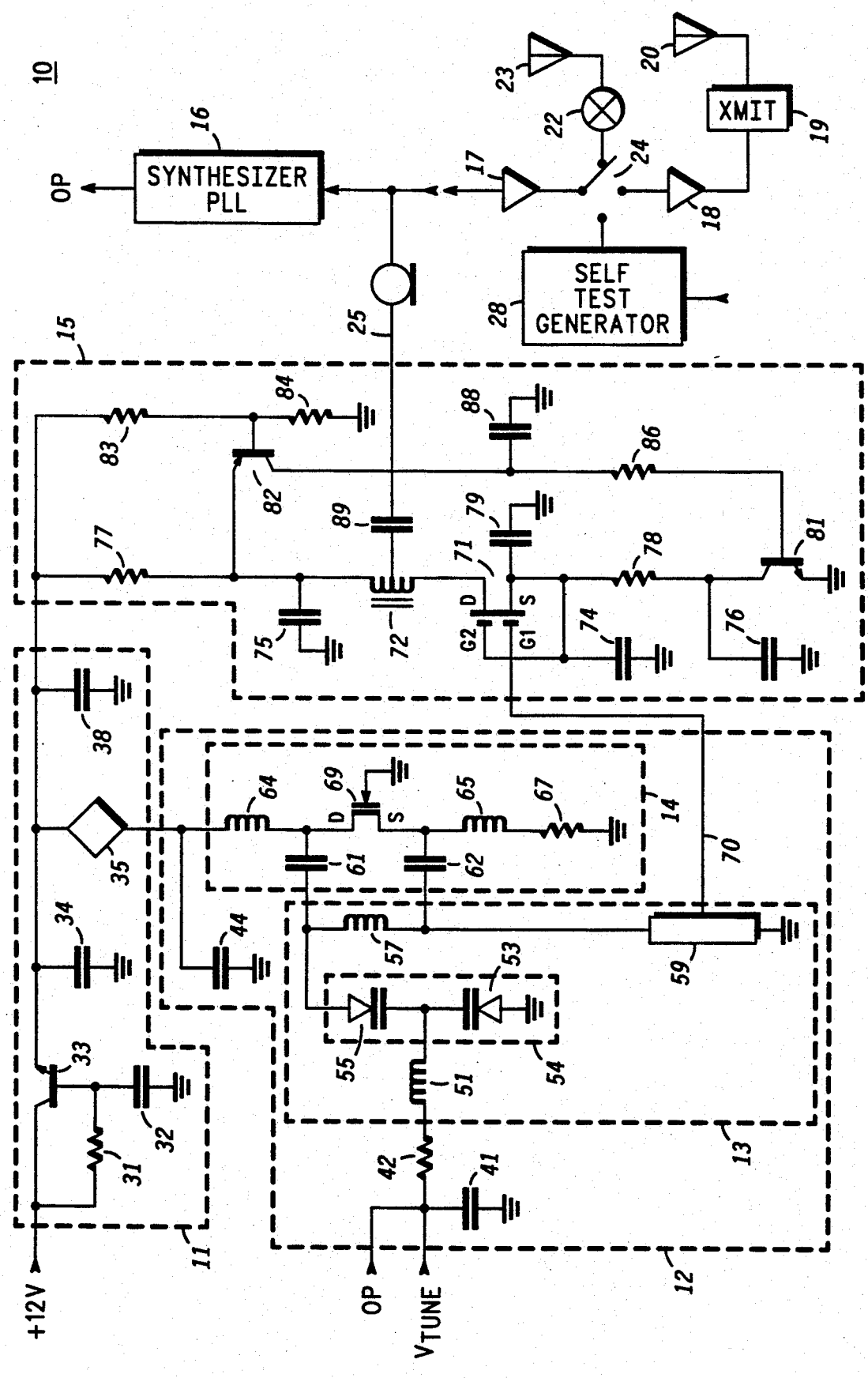

LOW NOISE OSCILLATOR

Background of the Invention

The present invention generally pertains to radios and more particularly to a frequency source for radios.

In a radio much of the noise generated by the radio transmitter and the inability to reject strong nearby signals is due to a relatively high sideband phase noise level on the transmitter exciter or receiver local oscillator produced by frequency source elements such as oscillators. Coupling useful power out of an oscillator or a voltage controlled oscillator is one source of phase noise introduction and, therefore, performance degradation. Generally, when RF power is coupled out of an oscillator circuit, the signal-to-noise ratio is decreased and, therefore, the noise of the radio frequency source is degraded.

With the desire to minimize the size of radios and at the same time increase performance, it is highly desirable that the noise floor of the oscillator circuit of a radio be as low as possible. Further, with the widespread use of portable radios, the task of producing a low floor noise oscillator circuit is made more difficult since the physical size of the radio and all its circuitry must be kept to a minimum and the power consumption of the circuit must be quite low.

Therefore, it is highly desirable to provide a radio including a low noise floor oscillator circuit which is small in size, requires relatively low power consumption, and is low in cost.

Summary of the Invention

In accordance with the present invention, a novel radio including a low noise floor oscillator is shown.

A low noise oscillator includes an input arrangement for receiving a DC tuning voltage proportional to an output frequency signal. A voltage controlled oscillator of the low noise oscillator transforms the DC tuning voltage to an intermediate sinusoidal output signal. The voltage controlled oscillator is coupled to the input arrangement. A buffer amplifier circuit is coupled to the voltage controlled oscillator. The buffer amplifier circuit transforms the intermediate sinusoidal output signal to the output signal of a particular frequency which is proportional to the DC tuning voltage. The output signal includes a high signal-to-noise ratio.

Brief Description of the Drawings

The single sheet of drawings included herewith is a schematic diagram of a radio including a low noise oscillator in accordance with the present invention.

Description of the Preferred Embodiment

Referring to the single sheet of drawings a radio including a low noise floor oscillator 10 is shown. Oscillator 10 includes power supply/regulator section 11; voltage controlled oscillator 12 which includes oscillator resonator circuit (TANK) 13, and amplifier (oscillator active) circuit 14; and buffer amplifier circuit 15.

Power supply/regulator section 11 includes a source of positive 12 volts coupled to the collector of transistor 33 and to resistor 31. Resistor 31 is coupled between the base and collector of transistor 33. Capacitor 32 is coupled between the base of transistor 33 and ground. The emitter of transistor 33 is coupled to capacitor 34 and to ferrite bead 35 and to capacitor 38. Capacitors 34 and 38 are also coupled to ground. Ferrite bead 35 is coupled to the voltage controlled oscillator (VCO) 12 via inductor 64. Ferrite bead 35 is a lossy element which decouples the power supply from the voltage controlled oscillator 12. Transistor 33 and capacitors 32, 34, and 38 provide for filtering out the noise of the power supply from being transmitted to the voltage controlled oscillator circuitry. Resistor 31 is a biasing resistor. Ferrite bead 35 is a lossy element which provides an impedance for the filter capacitors to work against.

Voltage controlled oscillator 12 includes an input on the $V_{TUNE}$ lead. Synthesizer/Phase Locked Loop (PLL) 16 provides adjustment to tuning voltage $V_{TUNE}$ lead. The output signal on lead OP is typically divided down and compared to a reference frequency to develop an error voltage which is amplified by a loop filter to produce a tuning signal in order to adjust the VCO frequency. The RC filter network composed of capacitor 41 and resistor 42 is coupled to the $V_{TUNE}$ lead. Capacitor 41 is also coupled to ground. Capacitor 41 provides for decoupling of input noise from the $V_{TUNE}$ lead and to contain RF energy in the oscillator. Resistor 42 is coupled to inductor 51. Inductor 51 decouples the tuning voltage on lead $V_{TUNE}$ for high impedance. Varactor 54 comprising diodes 53 and 55 is coupled to inductor 51. The varactor is a capacitance element which varies with voltage. Also included in the oscillator resonant circuit 13 of VCO 12 is inductor 57 which is coupled to the common connection of diode 55 and capacitor 61 and to capacitor 62. Inductor 57 is also coupled to the common connection of capacitor 62 and microstrip 59. Microstrip 59 is also coupled to ground. Microstrip 59 is approximately 400 mils in length by approximately 50 mils in width for UHF oscillators. The tap output on lead 70 of microstrip 59 is selected such that a large output voltage signal is provided while not over driving FET 71.

Capacitor 61 is coupled to the drain of Junction Field Effect Transistor (JFET) 69 and to inductor 64. Inductor 64 is coupled to the common connection of capacitor 44 and ferrite bead 35 for receiving power from the power supply 11. Capacitor 62 is coupled to the source of JFET 69. Inductor 65 is coupled to the common connection of capacitor 62 and the source of JFET 69. Resistor 67 is serially connected between inductor 65 and ground. Amplifier circuit 14 provides gain and feedback to oscillator resonant circuit 13. The gate of JFET 69 is coupled to ground. Choke inductors 64 and 65 operate to transmit bias voltage to JFET 69 without resistive loading of the oscillator RF circuit.

Buffer amplifier 15 includes Gallium Arsenide (GaAs) Field Effect Transistor (FET) 71. The intermediate sinusoidal output signal on lead 70 of oscillator resonant circuit 13 is coupled to a first gate (G1) of FET 71. FET 71 may be implemented with a MRF966 type FET which is low noise device with high input resistance at the first gate (G1) input. The second gate (G2) of FET 71 is coupled to RF bypass capacitor 74 and to the source of FET 71 and to resistor 78. Capacitor 74 is coupled to ground. The source of FET 71 is also coupled to ground through capacitor 79. Resistor 78 is coupled to the common connection of capacitor 76 and collector of transistor 81. Capacitor 76 and the emitter of transistor 81 are coupled to ground.

The biasing transistor 81 is coupled through resistor 86 and capacitor 88 and to the collector of transistor 82. Capacitor 88 is also coupled to ground. Resistors 77 and 83 are coupled between capacitor 38 and the emitter and base respectively of transistor 82. Resistor 84 is coupled to the common connection of the base of transistor 82 and resistor 83. Resistor 84 is also coupled to ground and forms a voltage dividing network along with resistor 83 to bias transistor 82.

Capacitor 75 is coupled between the common connection of the emitter of transistor 82 and resistor 77 and ground. Capacitor 75 provides AC ground at transformer 72. The emitter of transistor 82 is also coupled to an input to a center tapped transformer 72. Another input to transformer 72 is from the drain of FET 71. The signal transmitted by the drain of FET 71 is an amplified version of the intermediate sinusoidal output signal on lead 70 of oscillator resonant circuit 13. The active biasing networks comprising transistors 81 and 82 with associated components provide for a biasing current for FET 71. As a result, FET 71 is actively biased and the current provided by the drain of transistor 71 to transformer 72 is accurately held. In addition, the power output of transistor 71 is maximized because the active biasing arrangement of transistors 81 and 82 holds the bias current through transistor 71 near maximum.

Capacitor 89 removes the DC component present at the output of transformer 72 and provides the selected output signal on lead 25. Lead 25 may comprise coaxial cable as shown in the drawings.

Due to the buffer amplifier circuit 15, the output on lead 25 maintains a high signal to noise ratio at FET 71 input gate G1 and output signal over the tuning range of the oscillator. The tuning ranges over which the low noise oscillator circuit in the preferred embodiment may be operated are from approximately 115 to 174 MHz in the VHF band and from approximately 225 to 400 MHz in the UHF band. Further, the high signal to noise ratio and resulting low noise floor minimize reciprocal mixing of undesired signals by the receiver local oscillator. The low noise floor also reduces broadband transmitter noise which can mask weak desired signals to nearby receivers.

The output signal on lead 25 is fed back through synthesizer 16 to the $V_{TUNE}$ lead via the OP lead. In addition, the output signal is transmitted through amplifier 17 to switch 24. Switch 24 directs the selected output signal on lead 25 to mixer 22 and is combined with the received input signal from antenna 23 to select the appropriate frequencies for input.

Switch 24 also may be positioned to select the transmit function. In that case, amplifier 17 is coupled to amplifier 18 via switch 24. Amplifier 18 is coupled to the transmit circuitry 19 which in turn is coupled to the transmit antenna 20.

Switch 24 may also be positioned to provide the output on lead 25 through amplifier 17 to self-test generator 28. Self-test generator 28 provides signals to the radio unit so that it may perform self-testing in response to the various frequencies applied.

In a preferred embodiment of the invention, the values on component selections of the low noise oscillator may be such as shown below in Table 1.

TABLE 1

| ITEM | COMPONENT | VALUE/TYPE |
|---|---|---|
| 31 | resistor | 150 ohms |
| 32 | capacitor | 33 uf |
| 33 | transistor | MMBT2222A |
| 34 | capacitor | 470 pf |
| 35 | ferrite bead | |
| 38 | capacitor | 0.01 uf |
| 41 | capacitor | 470 pf |

TABLE 1-continued

| ITEM | COMPONENT | VALUE/TYPE |
|---|---|---|
| 42 | resistor | 470 ohms |
| 44 | capacitor | 470 pf |
| 51 | inductor | 680 nh |
| 57 | inductor | 5 nh |
| 61 | capacitor | 15 pf |
| 62 | capacitor | 68 pf |
| 64 | inductor | 680 nh |
| 65 | inductor | 680 nh |
| 67 | resistor | 68 ohms |
| 69 | JFET | U310 |
| 71 (dual gate) | GaAs FET | MRF966 |
| 74 | capacitor | 470 pf |
| 75 | capacitor | 470 pf |
| 76 | capacitor | 470 pf |
| 77 | resistor | 270 ohms |
| 78 | resistor | 51 ohms |
| 79 | capacitor | 470 pf |
| 81 | transistor | MMBT2222A |
| 82 | transistor | MMBT2907A |
| 83 | resistor | 27K ohms |
| 84 | resistor | 33K ohms |
| 86 | resistor | 2.7K ohms |
| 88 | capacitor | 0.1 uf |

In view of the foregoing description of the present invention, it should be appreciated that a high signal-to-noise ratio, low noise floor oscillator is shown. The low noise floor oscillator results from the use of a JFET in the amplifier circuit 14 and the use of a small microstrip in the oscillator resonant circuit 13. The microstrip may be tapped to provide the maximum voltage output. This high output voltage provides a large signal to noise ratio since it is fed into low noise Gallium Arsenide dual-gate FET. The use of the Gallium Arsenide FET permits a high output signal with relatively low noise. The result is that a high output voltage is obtained from the oscillator resonant circuit 13 at microstrip 59 while any noise generated within the oscillator is kept to a minimum.

The low noise oscillator shown above does not degrade the "Q" of the oscillator resonant circuit 13 while producing a high ratio of VCO signal to FET buffer noise voltage. In addition, this circuit provides for high reverse isolation, which prevents "pulling" of the VCO frequency by load disturbances, which is another potential contributor to noise.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A low noise oscillator comprising:
   input means adapted to receive a DC tuning voltage proportional to an output signal;
   voltage controlled oscillator means coupled to said input means, said voltage controlled oscillator means responsive to said DC tuning voltage for providing an intermediate sinusoidal output signal proportional to said DC tuning voltage; and
   buffer amplifier means coupled to said voltage controlled oscillator means, said buffer amplifier means transforming said intermediate sinusoidal output signal to said output signal of a particular frequency proportional to said DC tuning voltage by maintaining a nearly maximum power output to provide a high signal-to-noise ratio and a low noise floor.

2. A low noise oscillator as claimed in claim 1, wherein said voltage controlled oscillator means includes:
oscillator resonant circuit means coupled to said input means, said oscillator resonant circuit means providing said intermediate sinusoidal output signal of a frequency proportional to said DC tuning voltage; and
first amplifier means coupled in a feedback loop with said oscillator resonant circuit means, said first amplifier means providing gain to said intermediate sinusoidal output signal.

3. A low noise oscillator as claimed in claim 2, wherein said oscillator resonant circuit means includes:
a first inductor coupled to said input means; and
a varactor coupled to said first inductor, said varactor providing a capacitance which varies with said DC tuning voltage.

4. A low noise oscillator as claimed in claim 3, wherein said oscillator resonant circuit means further includes a second inductor coupled to said varactor.

5. A low noise oscillator as claimed in claim 4, wherein said oscillator resonant circuit means further includes a microstrip coupled serially between said second inductor and ground, said microstrip having a tap output for providing said intermediate sinusoidal output signal, said tap output of said microstrip being positioned such that said tap output maximizes a voltage of said intermediate sinusoidal output signal.

6. A low noise oscillator as claimed in claim 2, wherein said first amplifier means includes a junction field effect transistor (JFET), said JFET having a source input, a drain output, and an gate input, said gate input being coupled to ground, said source input and drain output being coupled in a feedback arrangement with said oscillator resonant circuit means.

7. A low noise oscillator as claimed in claim 6, wherein said first amplifier means further includes:
a first inductor coupled to said source input of said JFET; and
a resistor coupled between said first inductor and ground.

8. A low noise oscillator as claimed in claim 6, wherein said first amplifier means further includes second inductor means coupled to said drain output of said JFET.

9. A low noise oscillator as claimed in claim 8, wherein said first amplifier means further includes:
a first capacitor coupled between said source input of said JFET and said oscillator resonant circuit means; and
a second capacitor coupled between said drain output of said JFET and said oscillator resonant circuit means.

10. A low noise oscillator as claimed in claim 2, wherein said buffer amplifier means includes a dual gate field effect transistor (FET), said dual gate FET having first and second gate inputs, a source input and a drain output, said first gate input being coupled to said oscillator resonant circuit means for amplifying said intermediate sinusoidal output signal.

11. A low noise oscillator as claimed in claim 10, wherein said dual gate FET includes a Gallium Arsenide FET providing for low noise and having a high input resistance.

12. A low noise oscillator as claimed in claim 10, wherein said buffer amplifier means further includes active biasing means coupled to said dual gate FET, said active biasing means for providing bias current to said dual gate FET for maximizing power of said output signal.

13. A low noise oscillator as claimed in claim 12, wherein said active bias means includes:
first transistor means coupled to said source input of said dual gate FET via a first resistor, said first transistor means including a first transistor having a base, emitter, and collector, said first resistor being coupled between said source of said dual gate FET and said collector of said first transistor; and
second transistor means including a second transistor having a base, emitter, and collector, said collector of said second transistor coupled to said base of said first transistor via a second resistor.

14. A low noise oscillator as claimed in claim 13, wherein:
said first transistor means further includes:
a first capacitor coupled between said collector of said first transistor and ground;
a second capacitor coupled between said first resistor and ground; and
a third capacitor coupled between a common connection of said source and second gate inputs of said dual gate FET and said first resistor and ground; and
said second transistor means further including:
third resistor means coupled to said emitter of said second transistor;
fourth resistor coupled between third resistor and said base of said second transistor; and
fifth resistor coupled to a common connection of said base of said second transistor and said fourth resistor and ground.

15. A low noise oscillator as claimed in claim 14, wherein said buffer amplifier means further includes:
a transformer coupled between said third resistor and said drain output of said dual gate FET, said transformer providing a center tap output for impedance matching said output signal; and
sixth capacitor coupled to said center tap output of said transformer for providing said output signal.

16. In a radio, a low noise oscillator circuit for providing an output signal of a particular frequency for tuning said radio, said low noise oscillator comprising:
input means adapted to receive a DC tuning voltage proportional to said output signal;
voltage controlled oscillator means coupled to said input means, said voltage controlled oscillator means responsive to said DC tuning voltage for providing an intermediate sinusoidal output signal proportional to said DC tuning voltage;
buffer amplifier means coupled to said voltage controlled oscillator means, said buffer amplifier means transforming said intermediate sinusoidal output signal to said output signal of said particular frequency proportional to said DC tuning voltage by maintaining a nearly maximum power output to provide a high signal-to-noise ratio and a low noise floor; and
synthesizer/phase locked loop means coupled between said buffer amplifier means and said input means, said synthesizer means providing for adjusting said DC tuning voltage in response to said output signal.

17. In a radio, a low noise oscillator as claimed in claim 16, wherein there is further included:

means for switching coupled to the synthesizer means; and means for receiving coupled to the means for switching, said means for receiving being tuned to receive broadcast signals in response to said particular frequency indicated by said output signal.

18. In a radio, a low noise oscillator as claimed in claim 17, wherein there is further included means for transmitting coupled to said means for switching, said means for transmitting signals of said particular frequency of said output signal, said means for transmitting being operated in response to selection by said means for switching to transmit broadcast signals.

19. In a radio, a low noise oscillator as claimed in claim 17, wherein there is further included means for self-test generation coupled to said means for switching, said means for self-test generation operating in response to selection by said means for switching to produce a test signal for test tuning said radio and said low noise oscillator for a plurality of frequencies.

20. A low noise oscillator circuit comprising:

input means adapted to receive a DC tuning voltage;

oscillator resonant circuit means coupled to said input means, said oscillator resonant circuit means including a varactor for providing an intermediate sinusoidal output signal;

first amplifier means including a junction field effect transistor (JFET) coupled to said varactor of said oscillator resonant circuit means, said first amplifier means for amplifying said intermediate sinusoidal output signal;

buffer amplifier means including a dual gate field effect transistor, said dual gate field effect transistor coupled to said oscillator resonant circuit means, said buffer amplifier means providing an output signal whose frequency is proportional to said DC tuning voltage by maintaining a nearly maximum power output to provide a high signal-to-noise ratio and a low noise floor;

power supply means coupled to said JFET and to said dual gate field effect transistor, said power supply means for supplying a low noise power source; and output means coupled to said buffer amplifier means, said output means including coaxial cable for transmitting said output signal.

* * * * *